(12) United States Patent
Arai et al.

(10) Patent No.: US 11,525,845 B2
(45) Date of Patent: Dec. 13, 2022

(54) COMMON MODE VOLTAGE MEASURING DEVICE AND COMMON MODE VOLTAGE MEASURING METHOD

(71) Applicant: Nippon Telegraph and Telephone Corporation, Tokyo (JP)

(72) Inventors: Naruto Arai, Tokyo (JP); Ken Okamoto, Tokyo (JP); Jun Kato, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 139 days.

(21) Appl. No.: 17/270,386

(22) PCT Filed: Aug. 23, 2019

(86) PCT No.: PCT/JP2019/033165
§ 371 (c)(1),
(2) Date: Feb. 22, 2021

(87) PCT Pub. No.: WO2020/040310
PCT Pub. Date: Feb. 27, 2020

(65) Prior Publication Data
US 2021/0239739 A1   Aug. 5, 2021

(30) Foreign Application Priority Data
Aug. 24, 2018   (JP) .............................. JP2018-157131

(51) Int. Cl.
*G01R 15/16*    (2006.01)
*G01R 19/00*    (2006.01)
(52) U.S. Cl.
CPC ......... *G01R 15/16* (2013.01); *G01R 19/0084* (2013.01)

(58) Field of Classification Search
CPC ........ G01R 15/00; G01R 15/14; G01R 15/16; G01R 19/00; G01R 19/0084; G01R 19/0092
(Continued)

(56) References Cited

U.S. PATENT DOCUMENTS 5,949,230 A * 9/1999 Kobayashi ............... G01R 1/07
324/544
2006/0087329 A1   4/2006 Iwabuchi et al.
(Continued)

FOREIGN PATENT DOCUMENTS

JP   H08146046   6/1996
JP   2002-55126  2/2002
(Continued)

OTHER PUBLICATIONS

Kobayashi et al., "A Novel Non-contact Capacitive Probe for Common-Mode Voltage Measurement," IEICE Trans. Commun., Jun. 2007, E90-B(6):1329-1337.

*Primary Examiner* — Hoai-An D. Nguyen
(74) *Attorney, Agent, or Firm* — Fish & Richardson P.C.

(57) ABSTRACT

A common-mode voltage measurement apparatus according to an embodiment includes a measurement electrode attached to a conductor capable of being brought into contact with a coated cable, a measurement circuit configured to measure a common-mode voltage generated in the cable, and a compensation circuit connected in series between the measurement electrode and the measurement circuit, the compensation circuit being configured to compensate for a parasitic capacitive component formed between the measurement electrode and the conductor.

9 Claims, 10 Drawing Sheets

(58) Field of Classification Search
USPC .................................. 324/600, 649, 658, 684
See application file for complete search history.

(56) References Cited

U.S. PATENT DOCUMENTS

2012/0307413 A1    12/2012  Masuzawa
2013/0106779 A1*   5/2013   Company Bosch .... G06F 3/044
                                                  345/174

FOREIGN PATENT DOCUMENTS

| JP | 2005-214760 |   | 8/2005  |              |
|----|-------------|---|---------|--------------|
| JP | 2006-105824 |   | 4/2006  |              |
| JP | 2006242855 A| * | 9/2006  | ......... G01R 19/0084 |
| JP | 2012-156946 |   | 8/2012  |              |
| JP | 2012-251519 |   | 12/2012 |              |
| JP | 2015-169440 |   | 9/2015  |              |
| JP | 2017-90323  |   | 5/2017  |              |

* cited by examiner

|  | $f_1$ | $f_2$ | ... | $f_x$ | ... | $f_k$ |
|---|---|---|---|---|---|---|
| $L_1$ | 1.5 | 3.3 |  | 3.8 |  | 4.3 |
| $L_2$ | 2.2 | 2.3 |  | 1.8 |  | 3.3 |
| ... |  |  |  |  |  |  |
| $L_y$ | 2.4 | 3.5 |  | 4.0 |  | 5.2 |
| ... |  |  |  |  |  |  |
| $L_n$ | 1.3 | 1.6 |  | 2.6 |  | 3.3 |
| RECEIVED VOLTAGE | 2.4 | 3.5 |  | 4.0 |  | 5.2 |

Fig. 12

COMMON MODE VOLTAGE MEASURING DEVICE AND COMMON MODE VOLTAGE MEASURING METHOD

CROSS-REFERENCE TO RELATED APPLICATIONS

This application is a National Stage application under 35 U.S.C. § 371 of International Application No. PCT/JP2019/033165, having an International Filing Date of Aug. 23, 2019, which claims priority to Japanese Application Serial No. 2018-157131, filed on Aug. 24, 2018. The disclosure of the prior application is considered part of the disclosure of this application, and is incorporated in its entirety into this application.

TECHNICAL FIELD

Embodiments of the present invention relate to a common-mode voltage measurement apparatus and a common-mode voltage measurement method.

BACKGROUND ART

Waves of common-mode electromagnetic interference generated between the ground and a cable such as a power cable or a communication cable connecting electronic devices such as communication devices or power supply devices may sometimes propagate through the cable and enter the electronic devices, causing a failure of the electronic devices.

For example, a failure such as a decrease in communication speed or communication disconnection will occur if the damaged device is a communication device. To determine whether the cause of the failure is an electromagnetic interference wave or to determine the cause of the failure, it is necessary to measure a common-mode voltage of the electromagnetic interference wave.

It is desirable that a common-mode voltage measurement apparatus that measures a common-mode voltage be small and light from the viewpoints of portability and ease of handling in the failure site. It is also desirable to measure a common-mode voltage from the outer surface of a coating of a cable connected to an electronic device to be measured such that the operation of the electronic device is not affected.

A common-mode voltage measurement apparatus of the related art described below is a device for measuring a common-mode voltage of an electromagnetic interference wave by using a capacitive voltage probe having a double-structured electrode (see, for example, Non Patent Literature 1).

FIG. 15 is a diagram illustrating an example of the common-mode voltage measurement apparatus of the related art.

As illustrated in FIG. 15, the common-mode voltage measurement apparatus of the related art includes a capacitive voltage probe 101 using double electrodes and a measurement circuit 102. The electrodes of the capacitive voltage probe 101 are a cylindrical inner electrode 101a and a cylindrical outer electrode 101b.

The inner electrode 101a is installed to cover the cable 105 via a fixture made of sponge rubber. The outer electrode 101b is installed to cover the inner electrode 101a via a spacer made of polytetrafluoroethylene and is electrically grounded.

One end of the measurement circuit 102 is electrically connected to the inner electrode 101a via a conductor such as an electrical wire. The other end of the measurement circuit 102 is electrically grounded. The measurement circuit 102 is formed by connecting an electrostatic capacitive component (hereinafter also referred to as a capacitive component) $C_p$, a resistor $R_p$, and a voltmeter in parallel.

FIG. 16 is a diagram illustrating an example of an equivalent circuit of the common-mode measurement apparatus of the related art.

In the example illustrated in FIGS. 15 and 16, a common-mode voltage of an electromagnetic interference wave is denoted by V, a capacitive component between the cable 105 and the inner electrode 101a is denoted by C, and a capacitive component between the inner electrode 101a and the outer electrode 101b is denoted by Cs. Here, an AC voltage $V_p$ indicated on the voltmeter can be expressed by the following Equation (1) in a frequency range of $1 \ll \omega R_p (C+C_s+C_p)$.

[Math. 1]

$$V_P = \frac{C}{C + C_S + C_P} V \qquad \text{Equation (1)}$$

Here, ω represents the angular frequency of the common-mode voltage V to be measured. That is, as illustrated in FIG. 16, the voltmeter can indirectly measure the common-mode voltage by measuring a voltage divided by the combined impedance of the capacitive component C between the inner electrode 101a and the cable 105, the capacitive component $C_s$ between the inner electrode 101a and the outer electrode 101b, and the measurement circuit 102. The voltmeter is an AC voltmeter or any other meter, such as an oscilloscope, that can measure the magnitude of an AC voltage.

The common-mode voltage measurement apparatus illustrated in FIG. 15 can measure the common-mode voltage from the outer surface of the coating of the cable 105 and therefore can measure a common-mode voltage of a communication cable connected to an operating electronic device without affecting the operation of the electronic device.

CITATION LIST

Non Patent Literature

Non Patent Literature 1: R. Kobayashi, Y. Hiroshima, H. Ito, H. Furuya, M. Hattori, and Y. Tada, "A Novel Non-contact Capacitive Probe for Common-Mode Voltage Measurement," IEICE TRANS. COMMUN., vol. E90-B, No. 6, 2007.

SUMMARY OF THE INVENTION

Technical Problem

From the viewpoint of cost reduction, it is desirable that the common-mode voltage measurement apparatus have a simpler configuration. However, the common-mode voltage measurement apparatus of the related art described above requires the capacitive voltage probe having a special shape using double electrodes while having an advantage of being capable of measuring the common-mode voltage from the outer surface of the coating of the cable.

The present invention has been made in view of the above circumstances and it is an object of the present invention to provide a common-mode voltage measurement apparatus and a common-mode voltage measurement method that can measure a common-mode voltage with a simple configuration.

Means for Solving the Problem

To achieve the above object, a first aspect of a common-mode voltage measurement apparatus according to an embodiment of the present invention is a common-mode voltage measurement apparatus including a measurement electrode configured to be attached to a conductor capable of being brought into contact with a coated cable, a measurement circuit configured to measure a common-mode voltage generated in the cable, and a compensation circuit configured to be connected in series between the measurement electrode and the measurement circuit, the compensation circuit being configured to compensate for a parasitic capacitive component formed between the measurement electrode and the conductor.

A second aspect of the common-mode voltage measurement apparatus of the present invention is the first aspect wherein the conductor includes a metallic rod-shaped member.

A third aspect of the common-mode voltage measurement apparatus of the present invention is the first aspect wherein the conductor includes a human body.

A fourth aspect of the common-mode voltage measurement apparatus of the present invention is any one of the first to third aspects wherein the compensation circuit includes a negative impedance converter circuit configured to generate a negative capacitive component corresponding to the parasitic capacitive component.

A fifth aspect of the common-mode voltage measurement apparatus of the present invention is any one of the first to third aspects wherein the compensation circuit includes an inductor an inductance of which is variable, the inductor being configured to compensate for the parasitic capacitive component through series resonance with the parasitic capacitive component.

A first aspect of a common-mode voltage measurement method performed by a common-mode voltage measurement apparatus according to an embodiment of the present invention is a common-mode voltage measurement method performed by a common-mode voltage measurement apparatus including a measurement electrode configured to be attached to a metallic rod-shaped member capable of being brought into contact with a coated cable, a measurement circuit configured to measure a common-mode voltage generated in the cable, and a compensation circuit configured to be connected in series between the measurement electrode and the measurement circuit, the compensation circuit being configured to compensate for a parasitic capacitive component formed between the measurement electrode and the rod-shaped member, the common-mode voltage measurement method including attaching the measurement electrode to the rod-shaped member in a state where the rod-shaped member is not electrically grounded and measuring the common-mode voltage with the measurement circuit in a state where the rod-shaped member is in contact with a coating of the cable.

A second aspect of the common-mode voltage measurement method of the present invention is a common-mode voltage measurement method performed by a common-mode voltage measurement apparatus including a measurement electrode configured to be attached to a human body capable of being brought into contact with a coated cable, a measurement circuit configured to measure a common-mode voltage generated in the cable, and a compensation circuit configured to be connected in series between the measurement electrode and the measurement circuit, the compensation circuit being configured to compensate for a parasitic capacitive component formed between the measurement electrode and the human body, the common-mode voltage measurement method including attaching the measurement electrode to the human body in a state where the human body is not electrically grounded and measuring the common-mode voltage with the measurement circuit in a state where the human body is in contact with a coating of the cable.

A third aspect of the common-mode voltage measurement method of the present invention is the common-mode voltage measurement method according to the first or second aspect, wherein the compensation circuit includes an inductor an inductance of which is variable, the inductor being configured to compensate for the parasitic capacitive component through series resonance with the parasitic capacitive component, and the common-mode voltages are measured with the measurement circuit under conditions that a frequency is set and the inductance of the inductor is set to a plurality of types of inductances and it is determined that a maximum measured value among the common-mode voltages measured under the respective conditions is a measured value of the common-mode voltage at the frequency.

Effects of the Invention

According to the first to third aspects of the common-mode voltage measurement apparatus of an embodiment of the present invention, the compensation circuit for compensating for the parasitic capacitive component formed between the measurement electrode and the conductor is connected in series between the measurement electrode and the measurement circuit. This eliminates the need to use the capacitive voltage probe having a double-structured electrode or the like, so that the common-mode voltage of the electromagnetic interference wave can be accurately measured with a simple configuration and the common-mode voltage measurement apparatus can be made smaller and lighter.

According to the fourth aspect of the common-mode voltage measurement apparatus of the embodiment of the present invention, the compensation circuit includes a negative impedance converter circuit configured to generate a negative capacitive component corresponding to the parasitic capacitive component. This allows the common-mode voltage measurement apparatus to obtain a high reception sensitivity even in a relatively low frequency range.

According to the fifth aspect of the common-mode voltage measurement apparatus of the embodiment of the present invention, the compensation circuit includes an inductor an inductance of which is variable, the inductor being configured to compensate for the parasitic capacitive component through series resonance with the parasitic capacitive component. This allows an unnecessary parasitic capacitive component to be compensated for at a specific frequency.

That is, according to the present invention, a common-mode voltage can be accurately measured with a simple configuration.

BRIEF DESCRIPTION OF DRAWINGS

FIG. 12 is a diagram illustrating an example of determination of a received voltage at a time of measuring a common-mode voltage.

DESCRIPTION OF EMBODIMENTS

Embodiments according to the present invention will be described below with reference to the drawings.

Concept of Embodiment of Present Invention

A common-mode voltage measurement apparatus according to an embodiment of the present invention includes a measurement electrode attached to a conductor capable of being brought into contact with a coated cable, a measurement circuit configured to measure a common-mode voltage generated in the cable, and a compensation circuit connected in series between the measurement electrode and the measurement circuit. The compensation circuit is a circuit that compensates for a parasitic capacitive component formed between the measurement electrode and the conductor.

The measurement electrode is, for example, a conductive flat plate electrode. The measurement electrode is an electrode having conductivity such as, for example, a metallic electrode or a cloth-like electrode using conductive fibers. The conductor may be a metallic rod-shaped member or a human body. When a human body is used as the conductor, the measurement electrode is non-invasive to the human body.

With such a configuration, the common-mode voltage measurement apparatus according to the embodiment of the present invention can accurately measure the common-mode voltage with a simpler configuration without the need to use a capacitive voltage probe having a special structure such as a double-electrode structure.

A voltage relative to the ground that is generated in a cable including a single conductor is a voltage between a single line and the ground, not a common-mode voltage. However, in an embodiment of the present invention, it is possible to similarly measure this voltage between the single line and the ground, as in the case of the common-mode voltage.

First Embodiment

Next, a first embodiment of the present invention will be described.

Figure 1:
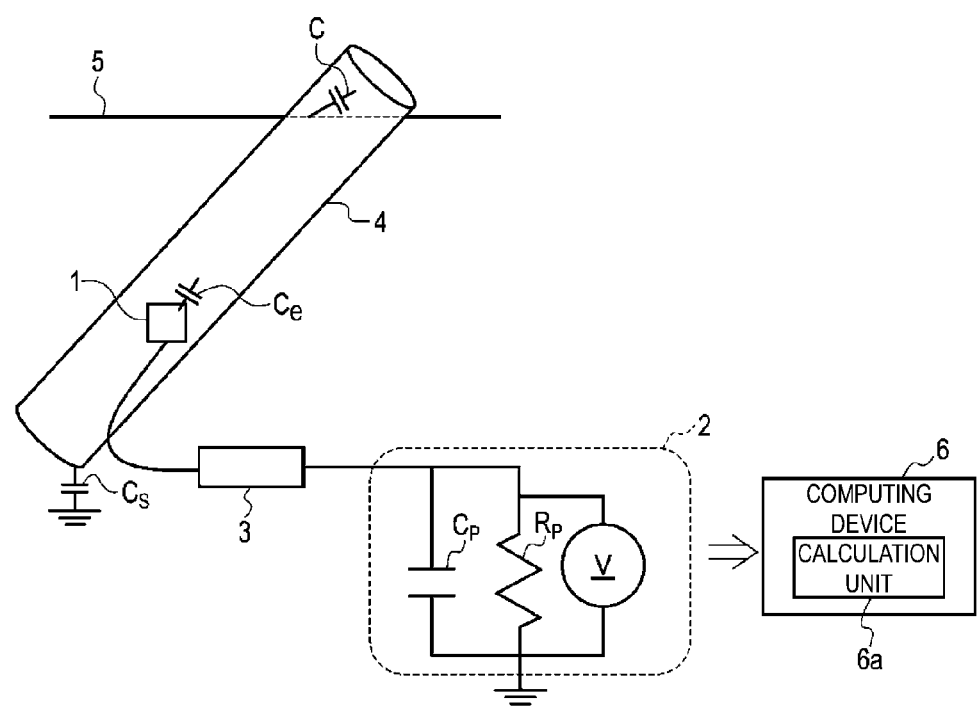
FIG. 1 is a diagram illustrating an example of a configuration of a common-mode voltage measurement apparatus according to a first embodiment of the present invention.

FIG. 1 is a diagram illustrating an example of a configuration of a common-mode voltage measurement apparatus according to a first embodiment of the present invention.

In the common-mode voltage measurement apparatus according to the first embodiment of the present invention, a metallic rod-shaped member 4 is used as a conductor to which a measurement electrode 1 is attached as illustrated in FIG. 1. The common-mode voltage measurement apparatus according to the present embodiment includes the measurement electrode 1, a measurement circuit 2, a compensation circuit 3, and a computing device 6. The measurement electrode 1 is attached to the metallic rod-shaped member 4 which is a conductor capable of being brought into contact with a coated cable 5. The compensation circuit 3 is connected in series between the measurement electrode 1 and the measurement circuit 2.

In the first embodiment, a capacitive component between the metallic rod-shaped member 4 and the cable 5 is denoted by C and a capacitive component between the metallic rod-shaped member 4 and the ground is denoted by $C_s$ as illustrated in FIG. 1. Further, a parasitic capacitive component formed between the measurement electrode 1 and the metallic rod-shaped member 4 is denoted by $C_e$ as illustrated in FIG. 1.

The measurement circuit 2 is formed by connecting a capacitive component, a resistor, and a voltmeter in parallel. The capacitive component and the resistor of the measurement circuit 2 are denoted by $C_p$ and $R_p$, respectively. One connection point of each of the capacitive component, the resistor, and the voltmeter is connected to the compensation circuit 3 and the other connection point of each of the capacitive component, the resistor, and the voltmeter is electrically grounded. The voltmeter measures a voltage between terminals of the capacitive component and terminals of the resistor in the measurement circuit 2.

It is assumed that the metallic rod-shaped member 4 is in a state of being electrically floated from the ground, that is, in a state of not being electrically grounded. The material of the rod-shaped member 4 is a metal having conductivity.

The shape and size of the rod-shaped member 4 are an appropriate shape and size in consideration of workability regarding measurement of the common-mode voltage.

The measurement electrode 1 is, for example, a conductive flat plate electrode. The compensation circuit 3 is a circuit for compensating for the parasitic capacitive component $C_e$ formed between the measurement electrode 1 and the metallic rod-shaped member 4. Specific examples of a configuration of the compensation circuit 3 will be described later. The computing device 6 can be configured, for example, as a computer including a central processing unit (CPU), a program memory, and a computing memory. As illustrated in FIG. 1, the computing device 6 includes a calculation unit 6a as a function necessary to carry out the present embodiment. The calculation unit 6a calculates the common-mode voltage of an electromagnetic interference wave generated in the cable 5 based on a voltage measured by the voltmeter of the measurement circuit 2 (also referred to as a received voltage). The measurement circuit 2 and the computing device 6 may be an integrated measurement circuit or device that obtains the common-mode voltage.

Figure 2:
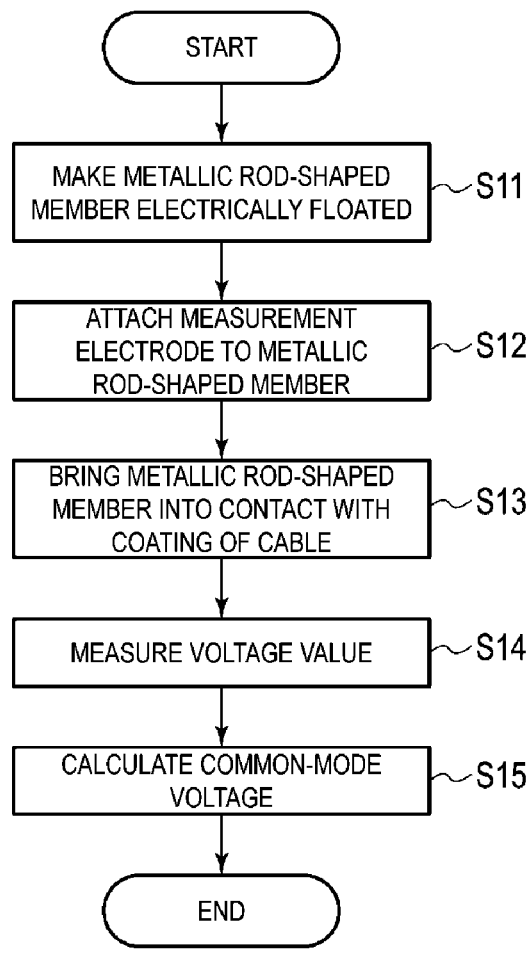
FIG. 2 is a diagram illustrating an example of a procedure of common-mode voltage measurement of the common-mode voltage measurement apparatus according to the first embodiment of the present invention.

Next, a procedure of common-mode voltage measurement performed using the common-mode voltage measurement apparatus illustrated in FIG. 1 will be described. FIG. 2 is a diagram illustrating an example of the procedure of common-mode voltage measurement of the common-mode voltage measurement apparatus according to the first embodiment of the present invention.

Prior to the measurement, a worker installs the metallic rod-shaped member 4 such that it is electrically floated from the ground (S11). Further, the worker attaches the measurement electrode 1 grounded via the compensation circuit 3 and the measurement circuit 2 to the metallic rod-shaped member 4 (S12). The worker holds the rod-shaped member 4 and brings a part of the rod-shaped member 4 into contact with the coating of the cable 5 of the electronic device to be measured (S13).

In this state, the worker can read a voltage value indicated on the voltmeter of the measurement circuit 2. The computing device 6 acquires this voltage value (S14). The calculation unit 6a of the computing device 6 can calculate a common-mode voltage V by converting the obtained voltage value using the above Equation (1) where the obtained voltage value is taken as $V_p$ (S15).

To prevent a voltage charged on the worker or the like from affecting the calculation of the common-mode voltage, it is desirable that the worker hold the rod-shaped member 4 while wearing insulating gloves in S13.

Second Embodiment

Next, a second embodiment of the present invention will be described. In the second embodiment, detailed descriptions of components common to the first embodiment will be omitted.

Figure 3:
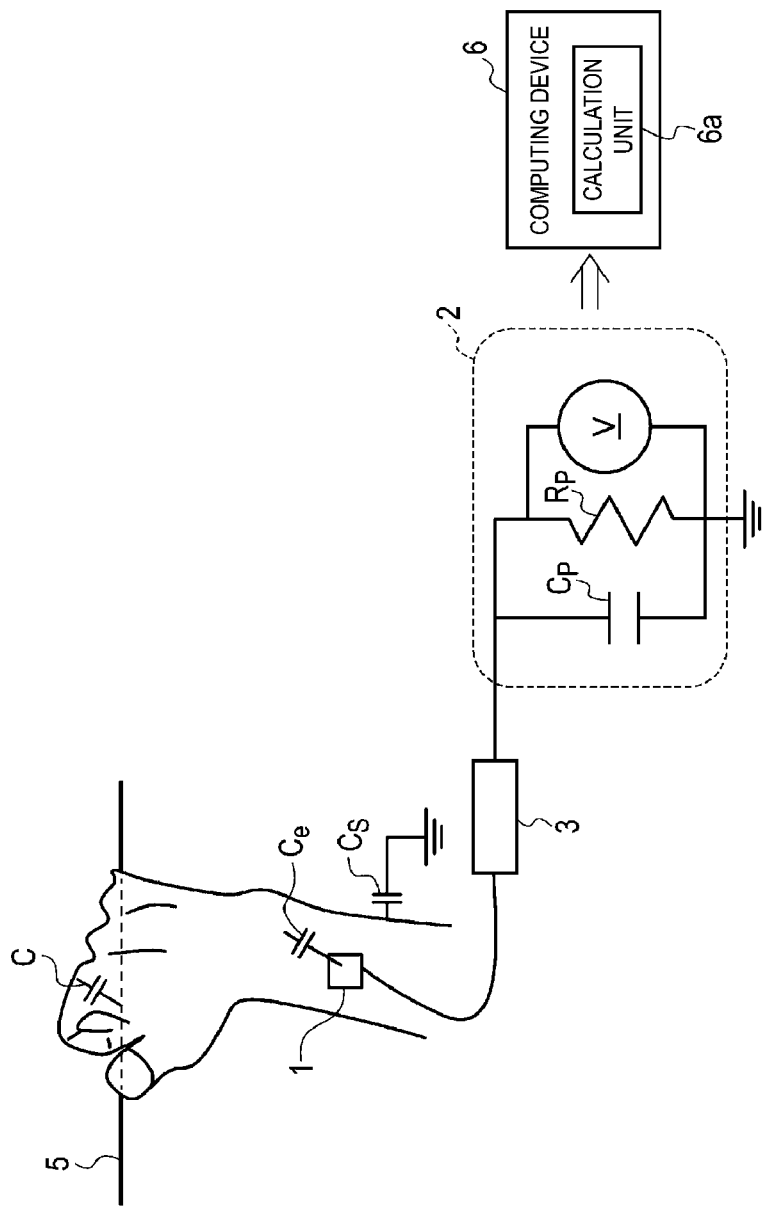
FIG. 3 is a diagram illustrating an example of a configuration of a common-mode voltage measurement apparatus according to a second embodiment of the present invention.

FIG. 3 is a diagram illustrating an example of a configuration of a common-mode voltage measurement apparatus according to the second embodiment of the present invention. In the common-mode voltage measurement apparatus according to the second embodiment, a human body such as an arm of the worker is used as a conductor to which a measurement electrode 1 is attached as illustrated in FIG. 3.

That is, as in the first embodiment, the common-mode voltage measurement apparatus according to the present embodiment includes the measurement electrode 1, a measurement circuit 2, a compensation circuit 3, and a computing device 6. The measurement electrode 1 is attached to a human body which is a conductor capable of being brought into contact with a coated cable 5. The compensation circuit 3 is connected in series between the measurement electrode 1 and the measurement circuit 2.

In this second embodiment, a capacitive component between the worker's hand and the cable 5 is denoted by C as illustrated in FIG. 3. Further, a capacitive component between the human body (arm) of the worker and the ground is denoted by $C_s$. In addition, a parasitic capacitive component formed between the measurement electrode 1 and the worker's wrist is denoted by $C_e$.

The measurement circuit 2, the measurement electrode 1, the compensation circuit 3, and the computing device 6 have the same configuration as those of the first embodiment. The calculation unit 6a calculates a common-mode voltage of an electromagnetic interference wave generated in the cable 5 based on a voltage measured by the voltmeter of the measurement circuit 2.

Considering workability regarding measurement of the common-mode voltage, it is desirable that the location where the measurement electrode 1 is attached close to the worker's wrist.

Figure 4:
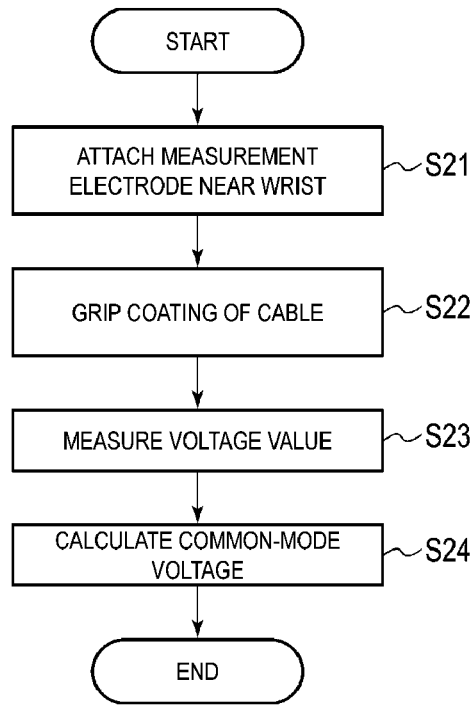
FIG. 4 is a diagram illustrating an example of a procedure of common-mode voltage measurement of the common-mode voltage measurement apparatus according to the second embodiment of the present invention.

Next, a procedure of common-mode voltage measurement performed using the common-mode voltage measurement apparatus illustrated in FIG. 3 will be described. FIG. 4 is a diagram illustrating an example of the procedure of common-mode voltage measurement of the common-mode voltage measurement apparatus according to the second embodiment of the present invention.

Prior to the measurement, the measurement electrode 1 grounded via the compensation circuit 3 and the measurement circuit 2 is attached near the wrist of the worker (human body) (S21). Here, it is assumed that the human body is in a state of being electrically floated from the ground. The worker grips the coating of the cable 5 of the electronic device to be measured with the measurement electrode 1 attached (S22).

In this state, the worker can read a voltage value indicated on the voltmeter of the measurement circuit 2. The computing device 6 acquires this voltage value (S23). The calculation unit 6a of the computing device 6 can calculate a common-mode voltage V by converting the obtained voltage value using the above Equation (1) where the obtained voltage value is used as $V_p$ (S24).

Configuration of Compensation Circuit

Next, a configuration of the compensation circuit 3 will be described.

Here, with reference to the common-mode voltage measurement apparatus according to the second embodiment illustrated in FIG. 3 as an example, the configuration of the compensation circuit 3 will be described below along with first and second specific examples of the compensation circuit. Of course, it goes without saying that matters described below are also applicable to the common-mode voltage measurement apparatus according to the first embodiment illustrated in FIG. 1.

Figure 5:
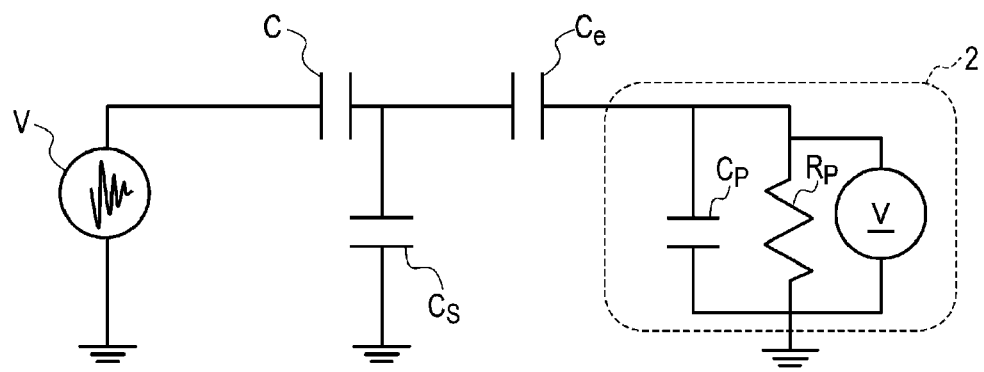
FIG. 5 is a diagram illustrating an example of an equivalent circuit of the common-mode voltage measurement apparatus.
Figure 6:
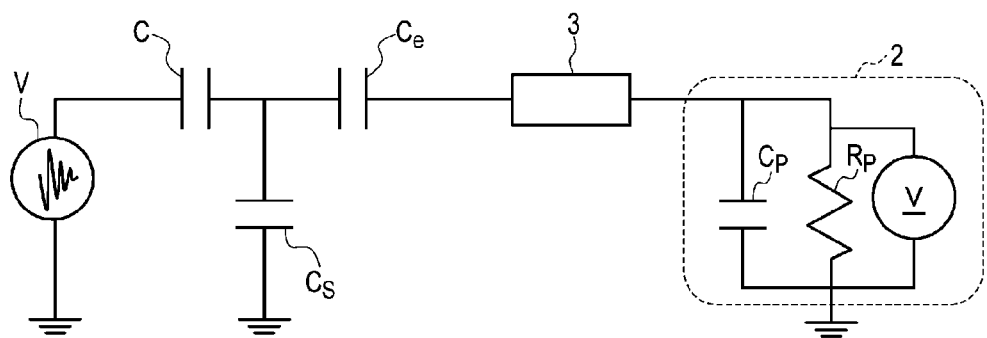
FIG. 6 is a diagram illustrating an example of the equivalent circuit of the common-mode voltage measurement apparatus.

FIGS. 5 and 6 are diagrams each illustrating an example of an equivalent circuit of the common-mode voltage measurement apparatus. FIG. 5 illustrates the equivalent circuit of the common-mode voltage measurement apparatus according to the second embodiment with the compensation circuit 3 removed. This is an equivalent circuit when the human body is electrically floated from the ground. Here, as illustrated in FIG. 3, the capacitive component between the cable 5 and the human body is denoted by C, the capacitive component between the human body and the ground is denoted by $C_s$, the parasitic capacitive component between the human body and the measurement electrode 1 is denoted by $C_e$, and the capacitive component and the resistor of the measurement circuit 2 are denoted by $C_p$ and $R_p$, respectively.

Figure 16:
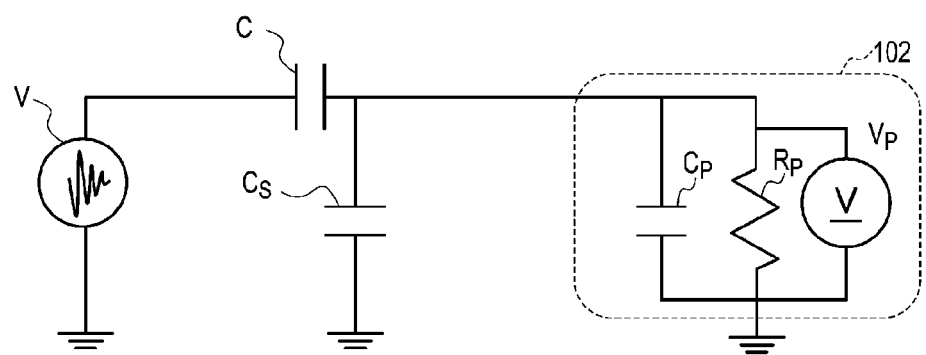
FIG. 16 is a diagram illustrating an example of an equivalent circuit of the common-mode measurement apparatus of the related art.

Comparing the equivalent circuit illustrated in FIG. 5 with the equivalent circuit of the related art illustrated in FIG. 16, the capacitive component C between the cable 5 and the inner electrode 101a in FIG. 16 corresponds to the capacitive component C between the cable 5 and the human body in FIG. 5.

Further, the capacitive component C, between the inner electrode 101a and the outer electrode 101b illustrated in FIG. 16 corresponds to the capacitive component C, between the human body and the ground in FIG. 5. On the other hand, the parasitic capacitive component $C_e$ between the human body and the measurement electrode 1 in FIG. 5 does not exist in the equivalent circuit illustrated in FIG. 16.

This parasitic capacitive component $C_e$ may reduce a measurement sensitivity when the common-mode voltage is measured. Therefore, in the second embodiment, the compensation circuit 3 for compensating for the parasitic capacitive component $C_e$ between the measurement circuit 2 and the measurement electrode 1 is inserted between the measurement circuit 2 and the measurement electrode 1 as illustrated in FIG. 6.

Here, it is assumed that the measurement circuit 2 is not grounded. In this case, a combination of the capacitive component between the measurement circuit 2 and the ground with the parasitic capacitive component $C_e$ between the conductor (the metallic rod-shaped member 4 or the human body) and the measurement electrode 1 may be considered as one capacitive component.

First Specific Example of Compensation Circuit

Next, a first specific example of the circuit for compensating for the parasitic capacitive component $C_e$ such as that between the human body and the measurement electrode 1 will be described.

In the first specific example, a negative impedance converter (NIC) circuit is used as the compensation circuit 3. The NIC circuit can compensate for the parasitic capacitive component Ce such as that between the human body and the measurement electrode 1 by generating a negative capacitive component corresponding to the parasitic capacitive component $C_e$. The parasitic capacitive component Ce can be estimated based on the shape, material, and size of the measurement electrode 1.

Thus, the compensation circuit 3 including the NIC circuit designed to cancel out (compensate for) the estimated parasitic capacitive component $C_e$ is inserted between the measurement electrode 1 and the measurement circuit 2, so that the parasitic capacitive component Ce can be compensated for.

Figure 7:
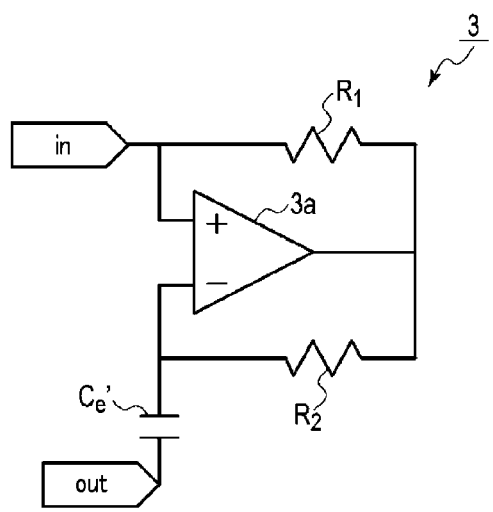
FIG. 7 is a diagram illustrating a first specific example of a compensation circuit.

FIG. 7 is a diagram illustrating the first specific example of the compensation circuit. FIG. 7 illustrates an example of a configuration of the NIC circuit that can be used to compensate for the parasitic capacitive component $C_e$. The NIC circuit illustrated in FIG. 7 includes (1) an operational amplifier 3a, (2) a feedback resistor $R_1$ connecting an output terminal and a positive input terminal of the operational amplifier 3a, (3) a feedback resistor $R_2$ connecting the output terminal and a negative input terminal of the operational amplifier 3a, and (4) a capacitive component $C_e'$ connected at one end thereof to the negative input terminal of the operational amplifier 3a.

The positive input terminal of the operational amplifier 3a is an input terminal of the NIC circuit and the other end of the capacitive component $C_e'$ is an output terminal of the NIC circuit. In the NIC circuit, the resistance values of the feedback resistors $R_1$ and $R_2$ are set to be equal.

The impedance Z of the NIC circuit can be expressed by the following Equation (2).

[Math. 2]

$$Z = -\frac{R_1}{R_2} * \frac{1}{j\omega C_e'} \qquad \text{Equation (2)}$$

It is to be noted that the NIC circuit is not limited to the configuration in which one operational amplifier is used as illustrated in FIG. 7, and a configuration in which a plurality of operational amplifiers are used or a configuration in which another active element such as a transistor is used may also be used.

Figure 8:
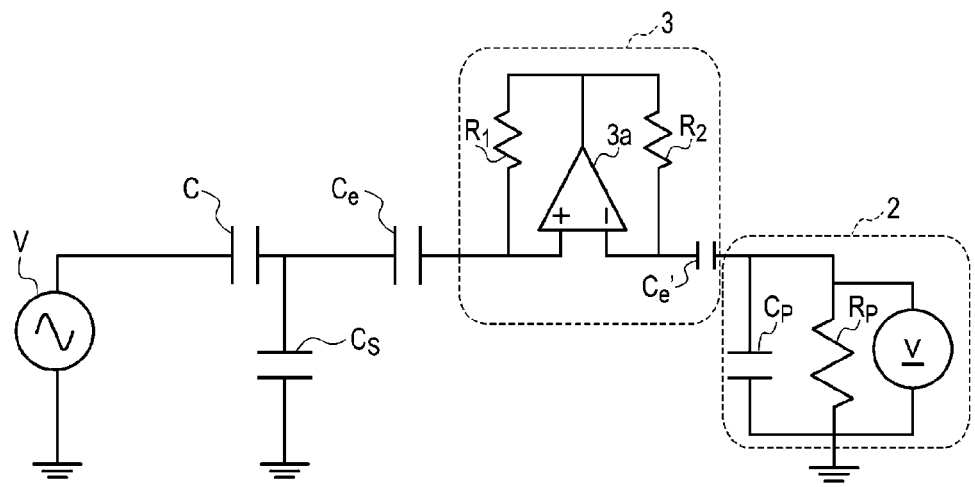
FIG. 8 is a diagram illustrating an equivalent circuit of a common-mode voltage measurement apparatus using an NIC circuit illustrated in FIG. 7.

FIG. 8 is a diagram illustrating an equivalent circuit of a common-mode voltage measurement apparatus adopting the NIC circuit illustrated in FIG. 7. The value of the capacitive component $C_e'$ provided in the NIC circuit is set to be the same as the parasitic capacitive component $C_e$ such as that between the human body and the measurement electrode 1.

Figure 9:
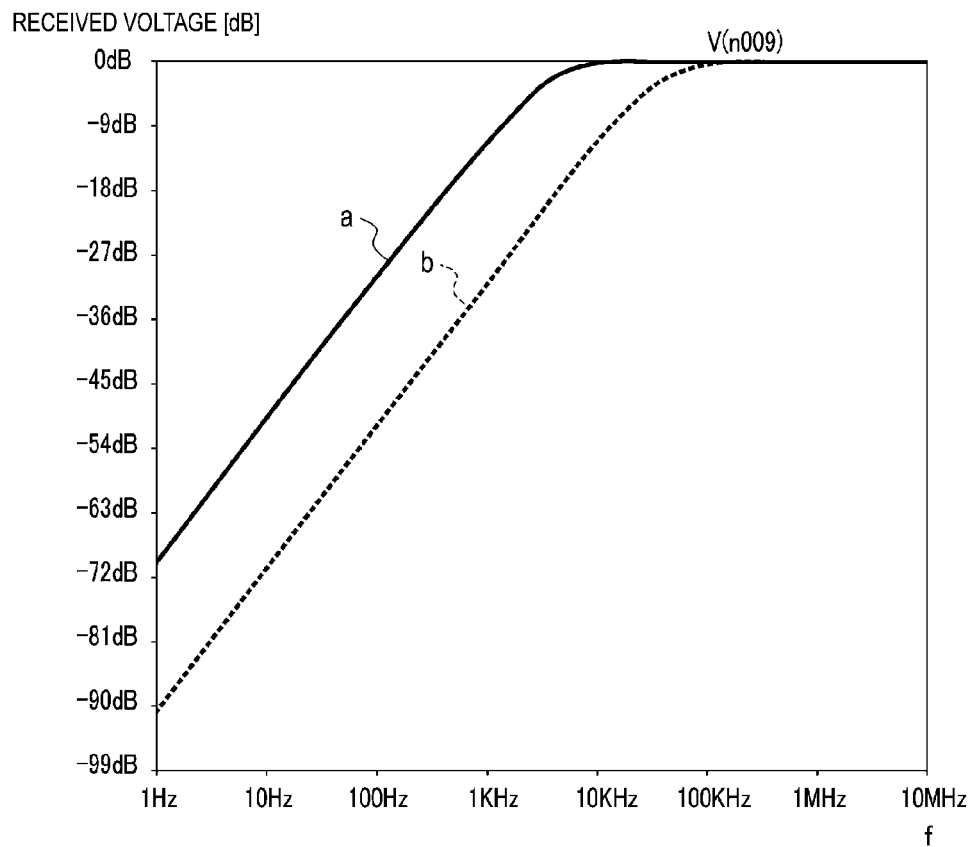
FIG. 9 is a diagram illustrating an example of a circuit analysis result of a voltage measured with a measurement circuit.

FIG. 9 is a diagram illustrating an example of a circuit analysis result of the voltage measured with the measurement circuit. The horizontal axis shown in FIG. 9 represents the frequency of the output voltage. The vertical axis shown in FIG. 9 represents the received voltage of the measurement circuit 2. In FIG. 9, "a" indicates an analysis result when the compensation circuit 3 serving as an NIC circuit is provided. In FIG. 9, "b" indicates an analysis result when the compensation circuit 3 serving as an NIC circuit is not provided.

By adopting the NIC circuit illustrated in FIG. 7 in the common-mode voltage measurement apparatus, it is possible to obtain a high reception sensitivity even in a relatively low frequency range as illustrated in FIG. 9. In this way, an unnecessary capacitive component can be canceled out through the NIC circuit to increase the reception sensitivity of the common-mode voltage measurement apparatus.

For example, when a human body or the like is used as the conductor, the actual capacitive component during measurement may change from the previously estimated capacitive component because of, for example, a failure of contact of the measurement electrode 1 with the human body due to sweating or movement. Therefore, by using a variable capacitive component as the capacitive component $C_e'$ provided in the NIC circuit, the amount of compensation of the NIC circuit can be made to follow the parasitic capacitive component $C_e$ that has changed during the measurement.

The capacitive component $C_e'$ provided in the NIC circuit illustrated in FIG. 7 may be achieved by, for example, (1) a trimmer capacitor a capacitance of which can be changed by turning a dial or (2) a varicap diode an electrostatic capacitive component of which can be changed by changing a voltage applied thereto. The capacitive component $C_e'$ is automatically changed and the measurement circuit 2 measures the voltage. Specifically, the capacitive component $C_e'$ in the NIC circuit is changed in n steps.

Here, n received voltages $V_p$ of the measurement circuit 2 are also measured. Assuming that a time when a maximum received voltage Vmax is measured among the measured received voltages is a time when the unnecessary parasitic capacitive component $C_e$ can be canceled out (compensated for), the computing device 6 calculates V using the above Equation (1) with $V_p$=Vmax to determine the measured value of the common-mode voltage.

The process of deriving such Vmax may be performed only once during measurement of the common-mode voltage, or if the common-mode voltage is continuously measured, this process may be repeated several times during the measurement.

Second Specific Example of Compensation Circuit

Next, a second specific example of the circuit for compensating for the parasitic capacitive component $C_e$ between the human body and the measurement electrode 1 will be described. In the second specific example, a variable inductor an inductance of which can be changed is used as the compensation circuit 3. This variable inductor is inserted between the measurement electrode 1 and the measurement circuit 2 and a series resonance of the variable inductor and the parasitic capacitive component $C_e$ occurs, so that the unnecessary parasitic capacitive component $C_e$ can be compensated for at a specific frequency.

The parasitic capacitive component $C_e$ between the human body and the measurement electrode 1 can be estimated based on the shape, material, and size of the measurement electrode 1 as described in the first specific example. Then, a resonance frequency can be obtained from the estimated parasitic capacitive component $C_e$ and the value of the variable inductor.

Thus, by measuring a received voltage at this resonance frequency, the measurement circuit 2 can measure a received voltage in a state where the unnecessary parasitic capacitive component $C_e$, which is a capacitive component that reduces a measurement sensitivity when the common-mode voltage is measured, is canceled out.

Figure 10:
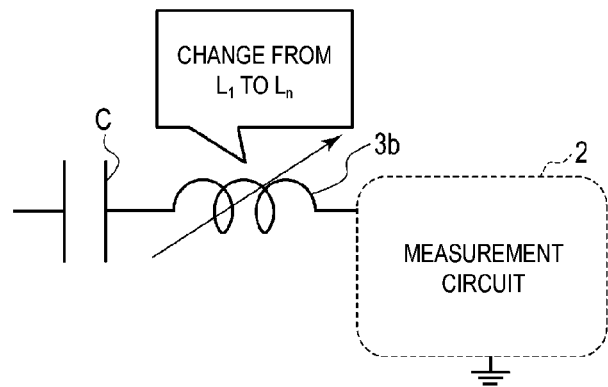
FIG. 10 is a diagram illustrating an example of common-mode voltage measurement when a variable inductor is used as the compensation circuit.
Figure 11:
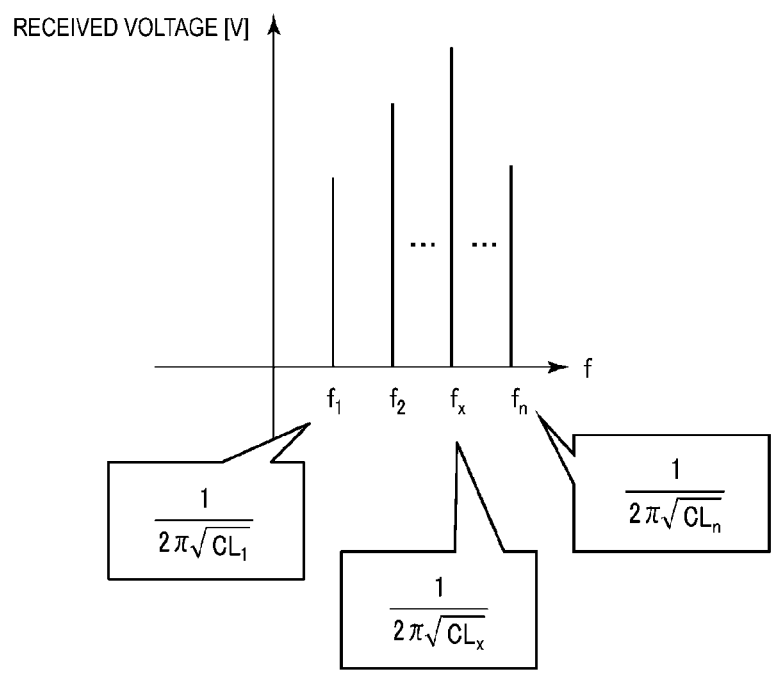
FIG. 11 is a diagram illustrating an example of common-mode voltage measurement when a variable inductor is used as the compensation circuit.

FIGS. 10 and 11 are diagrams illustrating an example of measurement of the common-mode voltage when a variable inductor is used as the compensation circuit 3.

In the example illustrated in FIG. 10, the compensation circuit 3 includes the variable inductor 3b and the value of the variable inductor 3b can be changed inn steps from $L_1$ to $L_n$. Here, n is a positive number. Then, the measurement circuit 2 measures a received voltage for each inductance.

Because a resonance frequency is uniquely determined for a value of the variable inductor, frequency characteristics of the received voltage can be measured as illustrated in FIG. 11 by sequentially plotting received voltages at the n resonance frequencies from frequency $f_1$ to frequency $f_n$.

For example, when a human body or the like is used as the conductor, the actual capacitive component during measurement may change from the previously estimated capacitive component because of, for example, a failure of contact of the measurement electrode 1 with the human body due to sweating or movement. Therefore, the value of the variable inductor is changed in n steps. Here, the measurement circuit 2 measures received voltages at each of k frequencies and the computing device 6 determines that the maximum voltage of n voltages which are measurement results corresponding to the n steps of the value of the variable inductor at the same frequency is a received voltage at a time of measuring the common-mode voltage at that frequency.

FIG. 12 is a diagram illustrating an example of determining the received voltage at a time of measuring the common-mode voltage. For example, referring to the column of frequency $f_x$ in FIG. 12, the maximum received voltage 4.0 V is measured when an inductor Ly is inserted. In the present embodiment, the computing device 6 can determine this 4.0 V as a received voltage when the frequency is $f_x$. In this way, the computing device 6 determines that the maximum voltage of the received voltages of the respective inductors at each frequency is a received voltage at a time of measuring the common-mode voltage at that frequency. That is, in the present embodiment, the measurement circuit 2 measures received voltages under conditions that a frequency is set and the inductance of the inductor is set to a plurality of types of inductances and the computing device 6 calculates V using Equation (1) where a maximum measured value Vmax among the received voltages measured under the conditions is taken as the received voltage $V_p$ to determine a measured value of the common-mode voltage at the set frequency.

Compensation Operation of Compensation Circuit

Next, a compensation operation of the compensation circuit will be described.

Figure 13:
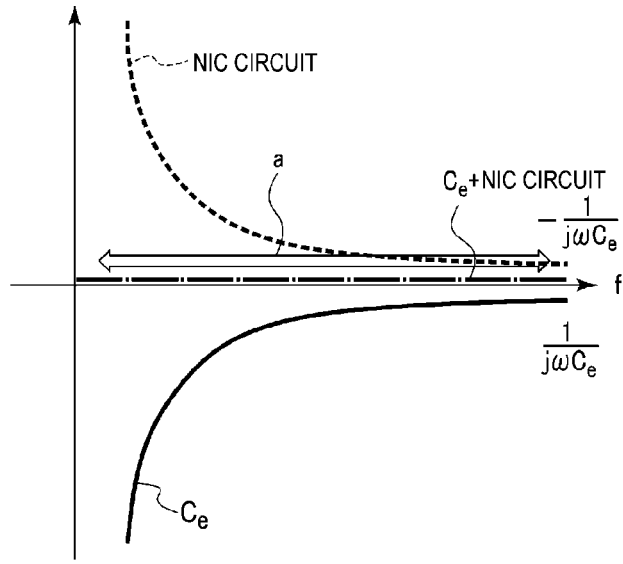
FIG. 13 is a diagram illustrating an example of a compensating operation of the compensation circuit used in the first specific example.
Figure 14:
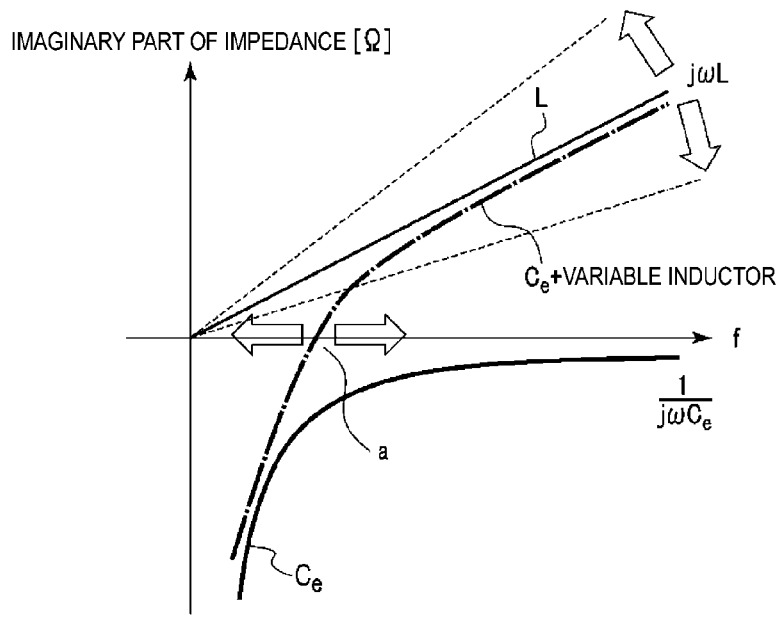
FIG. 14 is a diagram illustrating an example of a compensating operation of a compensation circuit used in a second specific example.
Figure 15:
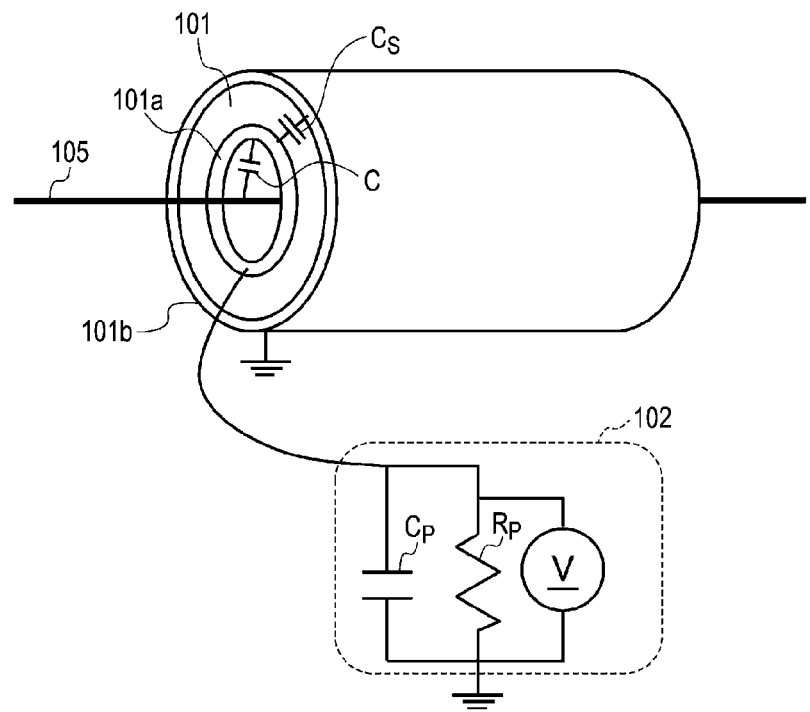
FIG. 15 is a diagram illustrating an example of a common-mode voltage measurement apparatus of the related art.

FIG. 13 is a diagram illustrating an example of the compensation operation of the compensation circuit (NIC circuit) 3 used in the first specific example. FIG. 14 is a diagram illustrating an example of the compensation operation of the compensation circuit (variable inductor) 3 used in the second specific example. In FIGS. 13 and 14, an ideal capacitive component, NIC circuit, and variable inductor are assumed.

The capacitive component of the NIC circuit which is the first specific example of the compensation circuit 3 (which corresponds to "NIC circuit" in FIG. 13) and the parasitic capacitive component between the human body and the measurement electrode 1 ("$C_e$" in FIG. 13) have a positive and negative relationship as illustrated in FIG. 13 (the vertical axis of coordinates represents the imaginary part of the impedance). Therefore, the NIC circuit can compensate for the parasitic capacitive component between the human body and the measurement electrode 1 in any frequency range (where the compensation result corresponds to "$C_e$+ NIC circuit" in FIG. 13). Therefore, $C_e$ is canceled out over a wide band as indicated by "a" in FIG. 13.

On the other hand, as illustrated in FIG. 14, the variable inductor ("L" in FIG. 14) which is the first specific example of the compensation circuit 3 can compensate for the parasitic capacitive component between the human body and the measurement electrode 1 ("$C_e$" in FIG. 14) at a specific frequency (where the compensation result corresponds to "$C_e$+variable inductor" in FIG. 14).

Therefore, when the variable inductor is used as the compensation circuit 3, frequency characteristics of the received voltage can be obtained by measuring a received voltage at each of a plurality of frequencies while scanning the value (inductance) of the variable inductor. By changing L, the frequency at which $C_e$ can be canceled out is changed as indicated by "a" in FIG. 14.

Effects Achieved by Embodiment of Present Invention

In the common-mode voltage measurement apparatus according to the embodiment of the present invention, a special probe used in the related art is replaced with a measurement electrode and a conductor or an equivalent thereof connected to the measurement electrode. This eliminates the need to use the special probe, so that the common-mode voltage of an electromagnetic interference wave can be accurately measured with a simple configuration and the common-mode voltage measurement apparatus can be made smaller and lighter.

It is to be noted that the present invention is not limited to the above embodiments and can be variously modified in the implementation stage without departing from the gist of the present invention. An appropriate combination of the embodiments can also be implemented, in which case a combination of their effects can be obtained. Further, the above embodiments include various inventions, which can be designed by combining constituent elements selected from a plurality of constituent elements disclosed here. For example, a configuration in which some constituent elements are removed from all the constituent elements shown in the embodiments can be designed as an invention if the problems can be solved and the effects can be achieved.

REFERENCE SIGNS LIST

1 Measurement electrode
2 Measurement circuit
3 Compensation circuit
3a Operational amplifier
3b Variable inductor
4 Metallic rod-shaped member
5 Cable
6 Computing device
6a Calculation unit

The invention claimed is:

1. A common-mode voltage measurement apparatus comprising:
   a measurement electrode configured to be attached to a conductor capable of being brought into contact with a coated cable;
   a measurement circuit configured to measure a common-mode voltage generated in the cable; and
   a compensation circuit configured to be connected in series between the measurement electrode and the measurement circuit, the compensation circuit being configured to compensate for a parasitic capacitive component formed between the measurement electrode and the conductor.

2. The common-mode voltage measurement apparatus according to claim 1, wherein the conductor includes a metallic rod-shaped member.

3. The common-mode voltage measurement apparatus according to claim 1, wherein the conductor includes a human body.

4. The common-mode voltage measurement apparatus according to claim 1 wherein the compensation circuit includes a negative impedance converter circuit configured to generate a negative capacitive component corresponding to the parasitic capacitive component.

5. The common-mode voltage measurement apparatus according to claim 1 wherein the compensation circuit includes an inductor an inductance of which is variable, the inductor being configured to compensate for the parasitic capacitive component through series resonance with the parasitic capacitive component.

6. A common-mode voltage measurement method performed by a common-mode voltage measurement apparatus, the common-mode voltage measurement apparatus including a measurement electrode configured to be attached to a metallic rod-shaped member capable of being brought into contact with a coated cable, a measurement circuit configured to measure a common-mode voltage generated in the cable, and a compensation circuit configured to be connected in series between the measurement electrode and the measurement circuit, the compensation circuit being configured to compensate for a parasitic capacitive component formed between the measurement electrode and the rod-shaped member, the common-mode voltage measurement method comprising:
   attaching the measurement electrode to the rod-shaped member in a state where the rod-shaped member is not electrically grounded and measuring the common-mode voltage with the measurement circuit in a state where the rod-shaped member is in contact with a coating of the cable.

7. The common-mode voltage measurement method according to claim 6, further comprising
   compensating for the parasitic capacitive component through series resonance with the parasitic capacitive component, using an inductor of variable inductance included in the compensation circuit; and
   measuring the common-mode voltages with the measurement circuit under conditions that a frequency is set and the inductance of the inductor is set to a plurality of types of inductances and it is determined that a maximum measured value among the common-mode voltages measured under the respective conditions is a measured value of the common-mode voltage at the frequency.

8. A common-mode voltage measurement method performed by a common-mode voltage measurement apparatus, the common-mode voltage measurement apparatus including a measurement electrode configured to be attached to a human body capable of being brought into contact with a coated cable, a measurement circuit configured to measure a common-mode voltage generated in the cable, and a compensation circuit configured to be connected in series between the measurement electrode and the measurement circuit, the compensation circuit being configured to compensate for a parasitic capacitive component formed between the measurement electrode and the human body, the common-mode voltage measurement method comprising:
   attaching the measurement electrode to the human body in a state where the human body is not electrically grounded and measuring the common-mode voltage with the measurement circuit in a state where the human body is in contact with a coating of the cable.

9. The common-mode voltage measurement method according to claim 8, further comprising compensating for the parasitic capacitive component through series resonance with the parasitic capacitive component, using an inductor of variable inductance included in the compensation circuit; and
   measuring the common-mode voltages with the measurement circuit under conditions that a frequency is set and the inductance of the inductor is set to a plurality of types of inductances and it is determined that a maximum measured value among the common-mode voltages measured under the respective conditions is a measured value of the common-mode voltage at the frequency.

* * * * *